(12) United States Patent
Chiu et al.

(10) Patent No.: US 10,459,544 B2
(45) Date of Patent: Oct. 29, 2019

(54) ELECTRONIC SYSTEM AND PROXIMITY SENSING METHOD

(71) Applicant: HTC Corporation, Taoyuan (TW)

(72) Inventors: Wei-Cheng Chiu, Taoyuan (TW); Wei-Chih Kuo, Taoyuan (TW)

(73) Assignee: HTC Corporation, Taoyuan (TW)

( * ) Notice: Subject to any disclaimer, the term of this patent is extended or adjusted under 35 U.S.C. 154(b) by 3 days.

(21) Appl. No.: 15/975,749

(22) Filed: May 9, 2018

(65) Prior Publication Data

US 2018/0335853 A1    Nov. 22, 2018

Related U.S. Application Data

(60) Provisional application No. 62/508,398, filed on May 19, 2017.

(51) Int. Cl.
*G06F 3/041*  (2006.01)
*G06F 3/038*  (2013.01)
(Continued)

(52) U.S. Cl.
CPC ............ *G06F 3/038* (2013.01); *A63F 13/214* (2014.09); *A63F 13/22* (2014.09); *A63F 13/24* (2014.09);
(Continued)

(58) Field of Classification Search
CPC ....................................................... G06F 3/041
See application file for complete search history.

(56) References Cited

U.S. PATENT DOCUMENTS

2006/0212134 A1    9/2006  Dhawan
2009/0078476 A1*   3/2009  Rimon ................ G06F 3/03545
                                                                178/18.03
(Continued)

FOREIGN PATENT DOCUMENTS

TW          201137710 A     11/2011
TW          201229876 A      7/2012
(Continued)

OTHER PUBLICATIONS

Corresponding Taiwan office action dated May 3, 2019.
(Continued)

*Primary Examiner* — Sanghyuk Park
(74) *Attorney, Agent, or Firm* — CKC & Partners Co., LLC

(57) ABSTRACT

An electronic system includes a hand-held controller and a computing application. The hand-held controller includes a proximity sensing circuit and a physical information sensing circuit. The proximity sensing circuit includes proximity sensors. The proximity sensors are configured to sense instant proximity values. The physical information sensing circuit is configured to sense a physical parameter. The computing application is executed by a processor. The computing application is configured to retrieve the instant proximity values and the physical parameter, to calculate maximum proximity values or minimum proximity values according to the instant proximity values and the physical parameter. The maximum proximity values or the minimum proximity values are utilized to update threshold proximity values of the proximity sensors in determining near status or far status.

20 Claims, 9 Drawing Sheets

(51) Int. Cl.
*G01B 11/14* (2006.01)
*G01S 17/08* (2006.01)
*G06F 3/0354* (2013.01)
*G01L 1/00* (2006.01)
*G06F 3/0488* (2013.01)
*G01K 3/06* (2006.01)
*H03K 17/955* (2006.01)
*H03K 17/96* (2006.01)
*A63F 13/24* (2014.01)
*A63F 13/22* (2014.01)
*A63F 13/214* (2014.01)
*H03K 17/945* (2006.01)
*G06F 3/0346* (2013.01)

(52) U.S. Cl.
CPC ............ *G01B 11/14* (2013.01); *G01K 3/06* (2013.01); *G01L 1/00* (2013.01); *G01S 17/08* (2013.01); *G06F 3/03547* (2013.01); *G06F 3/04883* (2013.01); *H03K 17/955* (2013.01); *H03K 17/962* (2013.01); *G06F 3/0346* (2013.01); *G06F 3/0416* (2013.01); *G06F 2203/0383* (2013.01); *H03K 17/945* (2013.01); *H03K 17/96* (2013.01); *H03K 2217/94026* (2013.01); *H03K 2217/94036* (2013.01); *H03K 2217/96035* (2013.01)

(56) References Cited

U.S. PATENT DOCUMENTS

| | | | |
|---|---|---|---|
| 2010/0164479 | A1 | 7/2010 | Alameh et al. |
| 2013/0127748 | A1 | 5/2013 | Vertegaal et al. |
| 2014/0302893 | A1 | 10/2014 | Dhavaloganathan |
| 2015/0242051 | A1* | 8/2015 | Ng ............... G06F 3/0418 345/174 |
| 2015/0268378 | A1 | 9/2015 | Chin et al. |
| 2017/0322649 | A1* | 11/2017 | Wang ............ G06F 3/044 |

FOREIGN PATENT DOCUMENTS

| | | |
|---|---|---|
| TW | 201514805 A | 4/2015 |
| TW | 201528100 A | 7/2015 |
| TW | 201716966 A | 5/2017 |

OTHER PUBLICATIONS

Corresponding extended European search report dated Sep. 17, 2018.

Corresponding Taiwan office action dated Dec. 25, 2018.

* cited by examiner

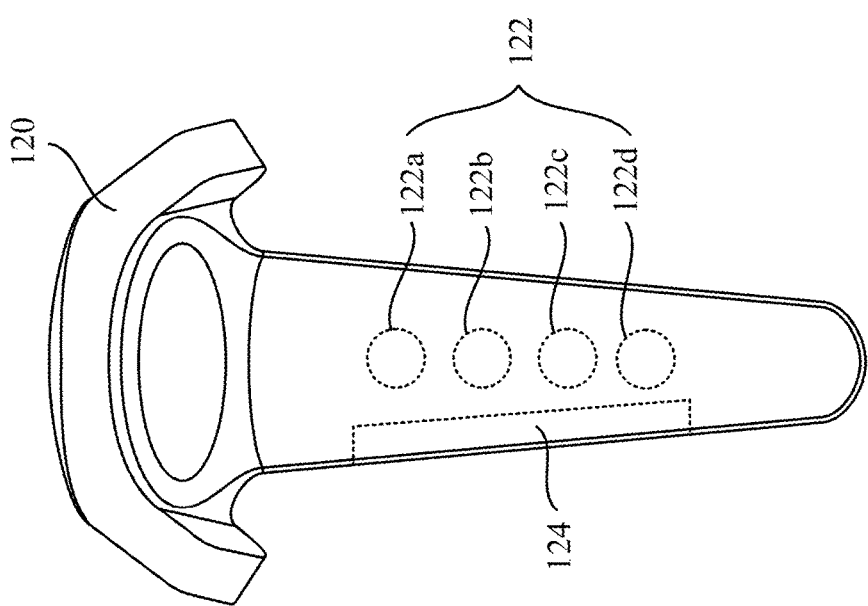

ELECTRONIC SYSTEM AND PROXIMITY SENSING METHOD

CROSS-REFERENCE TO RELATED APPLICATION

This application claims priority to U.S. Provisional Application Ser. No. 62/508,398, filed on May 19, 2017, which is herein incorporated by reference.

BACKGROUND

Field of Invention

Present disclosure relates to a system and a method for proximity detection. More particularly, the present disclosure relates to a system and a method for calibrating or updating a threshold value of proximity detection.

Description of Related Art

Proximity detection is a technology to detect a distance from a proximity sensor to a target object. The proximity sensor may generate a proximity value which reflects the distance. When the proximity value exceeds a threshold, the proximity sensor detects that the target object is near. On the other hand, when the proximity value is below a threshold, the proximity sensor detects that the target object is far. Proximity detection is useful in various applications. For example, the proximity sensor can be disposed on a mobile phone to detect whether the user is adjacent to the phone.

SUMMARY

The disclosure provides an electronic system, which includes a hand-held controller and a computing application. The hand-held controller includes a proximity sensing circuit and a physical information sensing circuit. The proximity sensing circuit includes proximity sensors. The proximity sensors are configured to sense instant proximity values. The physical information sensing circuit is configured to sense a physical parameter. The computing application is executed by a processor. The computing application is configured to retrieve the instant proximity values and the physical parameter, to calculate maximum proximity values or minimum proximity values according to the instant proximity values and the physical parameter. The maximum proximity values or the minimum proximity values are utilized to update threshold proximity values of the proximity sensors in determining near status or far status.

Another aspect of present disclosure is to provide a proximity sensing method, which include following steps. Instant proximity values are sensed by proximity sensors disposed on a hand-held controller. A physical parameter is sensed by a physical information sensing circuit disposed on the hand-held controller. Maximum proximity values or minimum proximity values are calculated according to the instant proximity values and the physical parameter. The maximum proximity values or the minimum proximity values are utilized to update threshold proximity values of the proximity sensors in determining near status or far status.

It is to be understood that both the foregoing general description and the following detailed description are by examples, and are intended to provide further explanation of the disclosure as claimed.

BRIEF DESCRIPTION OF THE DRAWINGS

Present disclosure can be more fully understood by reading the following detailed description of the embodiment, with reference made to the accompanying drawings as follows:

FIG. 2 is a schematic diagram illustrating a bottom view of the hand-held controller of the electronic system in FIG. 1A.

DETAILED DESCRIPTION

Figure 1A:
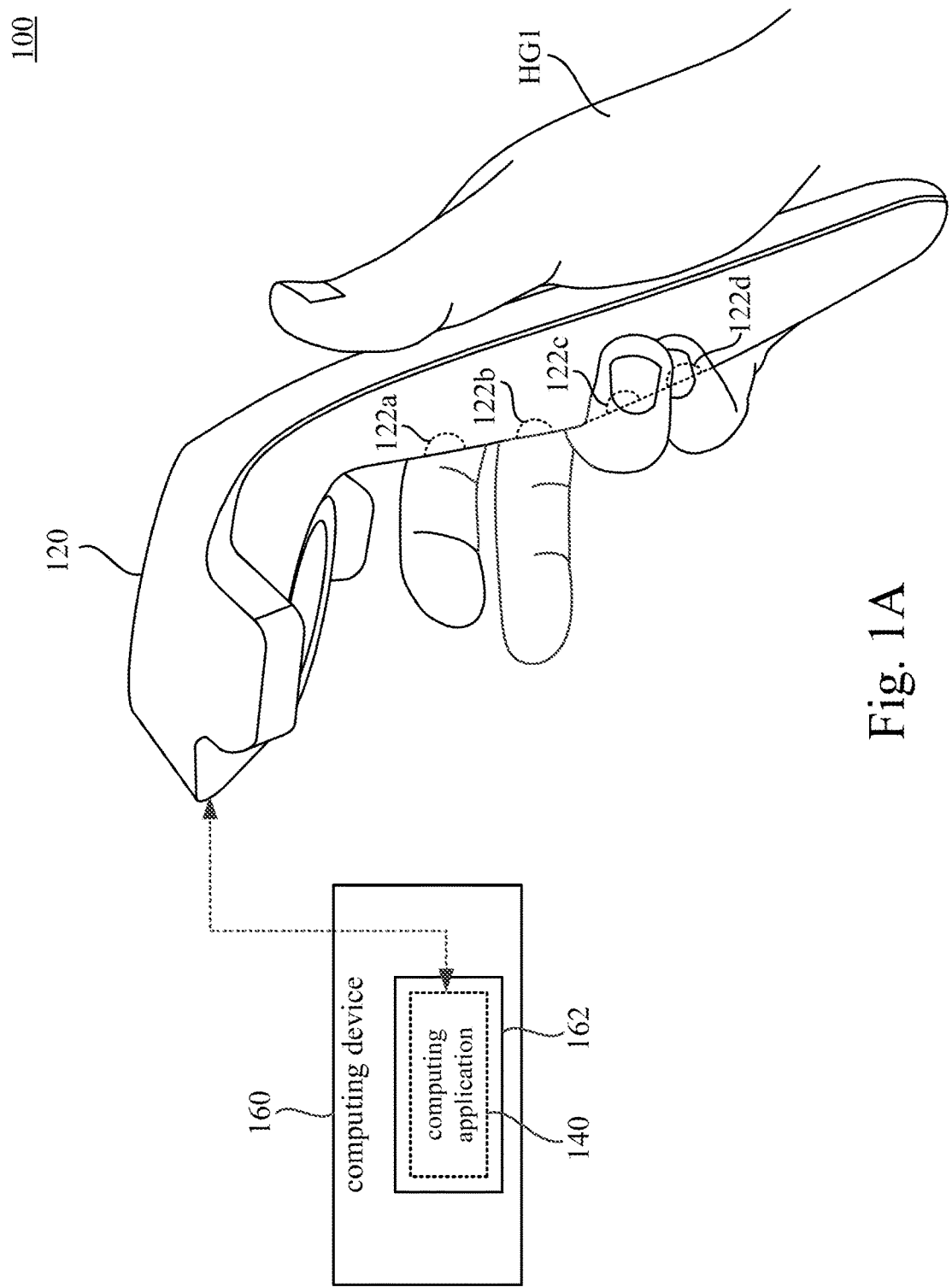
FIG. 1A is a schematic diagram illustrating an electronic system according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Figure 1B:
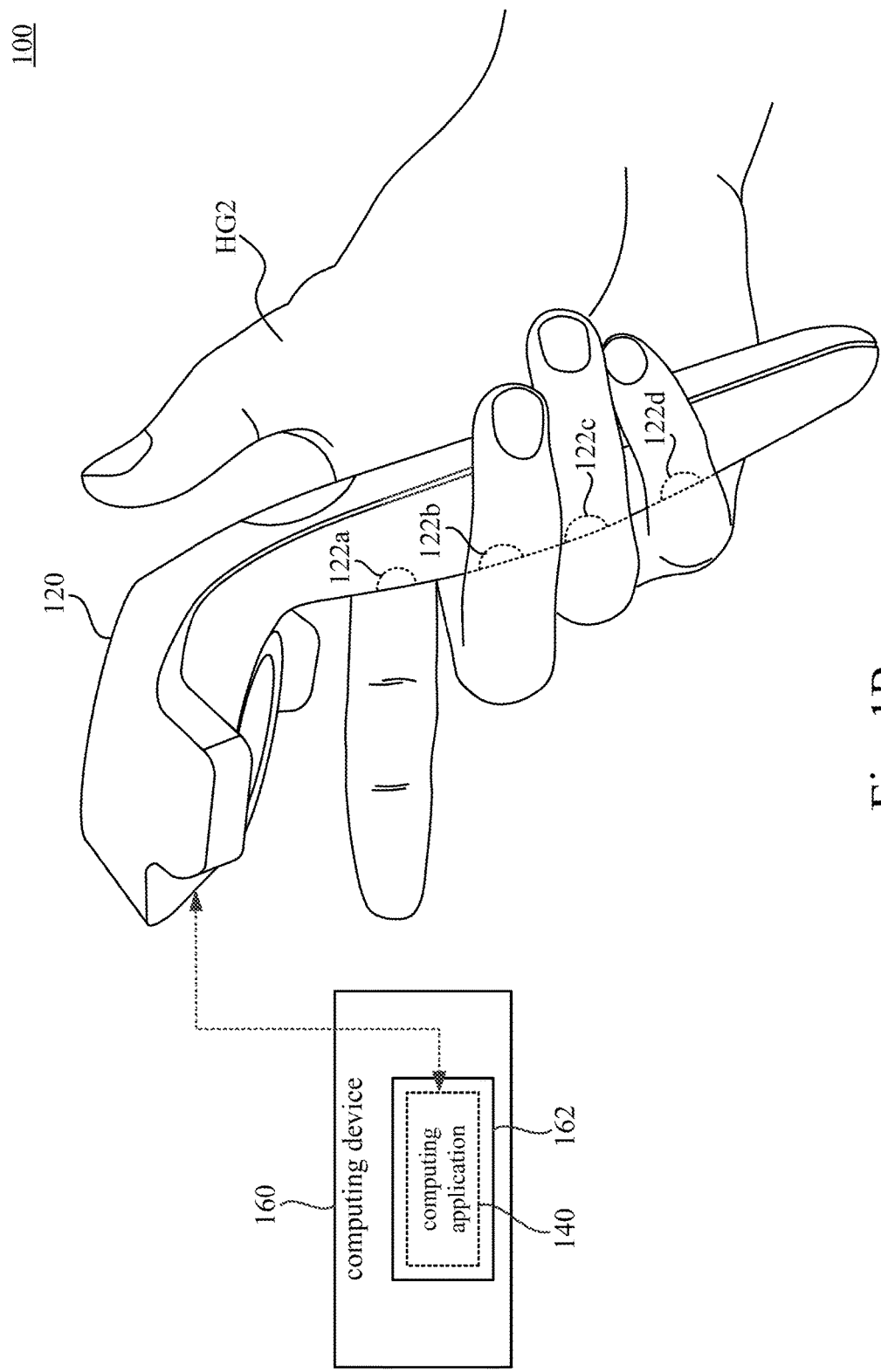
FIG. 1B is another schematic diagram illustrating the electronic system in FIG. 1A.

Reference is made to FIG. 1A and FIG. 1B. FIG. 1A is a schematic diagram illustrating an electronic system 100 according to some embodiments of the present disclosure. FIG. 1B is another schematic diagram illustrating the electronic system 100 in FIG. 1A. As illustrated in FIG. 1A, in one embodiment, the electronic system 100 includes a hand-held controller 120 and a computing application 140. In the embodiment shown in FIG. 1A, the computing application 140 is executed by a processor 162 of a computing device 160. The computing device 160 is communicatively connected through a wireless connection (e.g., WiFi, Bluetooth, BLE or IR) or a wired connection (e.g., via a cable wiring) to the hand-held controller 120.

In some embodiments, the computing device 160 can be a computer, a game console, a server or any equivalent device with computation ability. The processor 162 may be a CPU, GPU, ASIC or some control unit of the computing device 160, and the computing application 140 may be software or firmware executed by the processor 162. However, the electronic system 100 is not limited to include the computing device 160 and the processor 162 separated from the hand-held controller 120. In some other embodiments, the computing application 140 can be executed by a processor (not shown in figures) disposed in the hand-held controller 120.

Reference is also made to FIG. 2, which is a schematic diagram illustrating a bottom view of the hand-held controller 120 of the electronic system 100 in FIG. 1A. As shown in FIG. 2, the hand-held controller 120 includes a proximity sensing circuit 122 and a physical information sensing circuit 124. In the embodiment shown in FIG. 1A, FIG. 1B and FIG. 2, the proximity sensing circuit 122 include four proximity sensors 122a, 122b, 122c and 122d. In some embodiments, the proximity sensors 122a, 122b, 122c and 122d can be optical sensors (e.g., laser rangefinders, photoelectric sensors, infrared sensors or camera sensors) capable of measuring a distance toward an object in front of the optical sensors. In some other embodiments, the proximity sensors 122a, 122b, 122c and 122d can also be Ultrasonic sensors, Hall effect sensors, magnetic proximity sensors, Doppler effect sensors, Sonar sensors or Capacitive displacement sensors.

When the hand-held controller 120 is held by a hand (referring to FIG. 1A and FIG. 1B), the proximity sensors 122a, 122b, 122c and 122d are disposed on different positions to detect finger positions of the hand. The proximity sensor 122a is configured to detect a finger position of an index finger. The proximity sensor 122b is configured to detect a finger position of a middle finger. The proximity sensor 122c is configured to detect a finger position of a ring finger. The proximity sensor 122d is configured to detect a finger position of a little finger. In other words, the proximity sensing circuit 122 includes the proximity sensors 122a, 122b, 122c and 122d are able to detect a hand gesture when the hand-held controller 120 is hold by a user's hand.

However, the proximity sensing circuit 122 is not limited to include four proximity sensors 122a, 122b, 122c and 122d as shown in FIG. 1A, FIG. 1B and FIG. 2. In other embodiments, the proximity sensing circuit 122 may include more proximity sensors (e.g., five proximity sensors to cover thumb, index, middle, ring and little fingers) or fewer proximity sensors (e.g., three proximity sensors to cover middle, ring and little fingers).

As shown in FIG. 1A, the proximity sensors 122a and 122b will detect that the index finger and the middle finger are far, and the proximity sensors 122c and 122d will detect that the ring finger and the little finger are near. In this case, the proximity sensing circuit 122 can detect the hand gesture HG1 (the index finger and the middle finger are pointing out, and the ring finger and the little finger are grasping on the hand-held controller 120) in FIG. 1A.

Similarly, as shown in FIG. 1B, the proximity sensor 122a will detect that the index finger is far, and the proximity sensors 122b, 122c and 122d will detect that the middle finger, the ring finger and the little finger are near. In this case, the proximity sensing circuit 122 can detect the hand gesture HG2 (the index finger is pointing out, and the middle finger, the ring finger and the little finger are grasping on the hand-held controller 120) in FIG. 1B.

Each of the proximity sensors 122a-122d may generate an instant proximity value which reflects a gap distance from the proximity sensor (122a, 122b, 122c or 122d) to a target object (e.g., a corresponding finger). When the instant proximity value exceeds or closes to a maximal threshold proximity value, the proximity sensor 122a, 122b, 122c or 122d detects that the corresponding finger is near. On the other hand, when the proximity value is below or close to a minimal threshold proximity value, the proximity sensor 122a, 122b, 122c or 122d detects that the corresponding finger is far.

In some embodiments, the instant proximity value generated by the proximity sensors 122a, 122b, 122c or 122d is not only affected by the gap distance. The instant proximity value may be also affected by a reflective ratio or a color of the corresponding finger, and/or a brightness of a surrounding environment. If the threshold proximity value is fixed at the same level, some mistakes may occur when the proximity sensors 122a-122d are detecting finger positions while the hand-held controller 120 is held by a hand. For example, the finger positions corresponding to the same hand gesture (e.g., the hand gesture HG1 in FIG. 1A) detected by the proximity sensors 122a, 122b, 122c or 122d may have different results in different environments.

In some embodiment, the electronic system 100 is configured to calculate a calibration value to update the threshold proximity values of the proximity sensors 122a-122d in determining near status or far status. As shown in FIG. 2, the hand-held controller 120 includes a physical information sensing circuit 124. The physical information sensing circuit 124 is configured to sense a physical parameter. The physical parameter is related to some conditions (e.g., the user grips the hand-held controller 120 tighter or looser, a size of the user hand or a holding position of the user hand) which will affect the instant proximity values generated by the proximity sensors 122a-122d.

The computing application 140 is configured to retrieve the instant proximity values from the proximity sensors 122a-122d and the physical parameter from the physical information sensing circuit 124. The computing application 140 is configured to calculate maximum proximity values or minimum proximity values according to the instant proximity values and the physical parameter. In this case, the maximum proximity values or minimum proximity values calculated by the computing application 140 are calibrated according to the physical parameter. The maximum proximity values or the minimum proximity values are utilized to update the threshold proximity values of the proximity sensors 122a-122d in determining near status or far status. Details about how to calculate maximum proximity values or minimum proximity values will be introduced in following paragraphs.

In this case, the threshold proximity values of the proximity sensors 122a-122d in determining near status or far status can be dynamically updated in response to variance of the physical parameter. The proximity sensors 122a-122d will have higher preciseness in determining near status or far status.

In the embodiment shown in FIG. 1A, the hand-held controller 120 is held by the right hand of the user. The electronic system 100 is able to detect the hand gesture on the right hand of the user. However, the disclosure is not limited thereto. In another embodiment, when the hand-held controller 120 is held by the left hand of the user, the electronic system 100 is able to detect the hand gesture on the left hand of the user.

In still another embodiment, the electronic system 100 includes a pair of two hand-held controllers (not shown in FIG. 1A), and these two hand-held controllers are hold respectively by both hands of the user. In this embodiment, the electronic system 100 is able to detect the hand gestures on both hands of the user.

Figure 3:
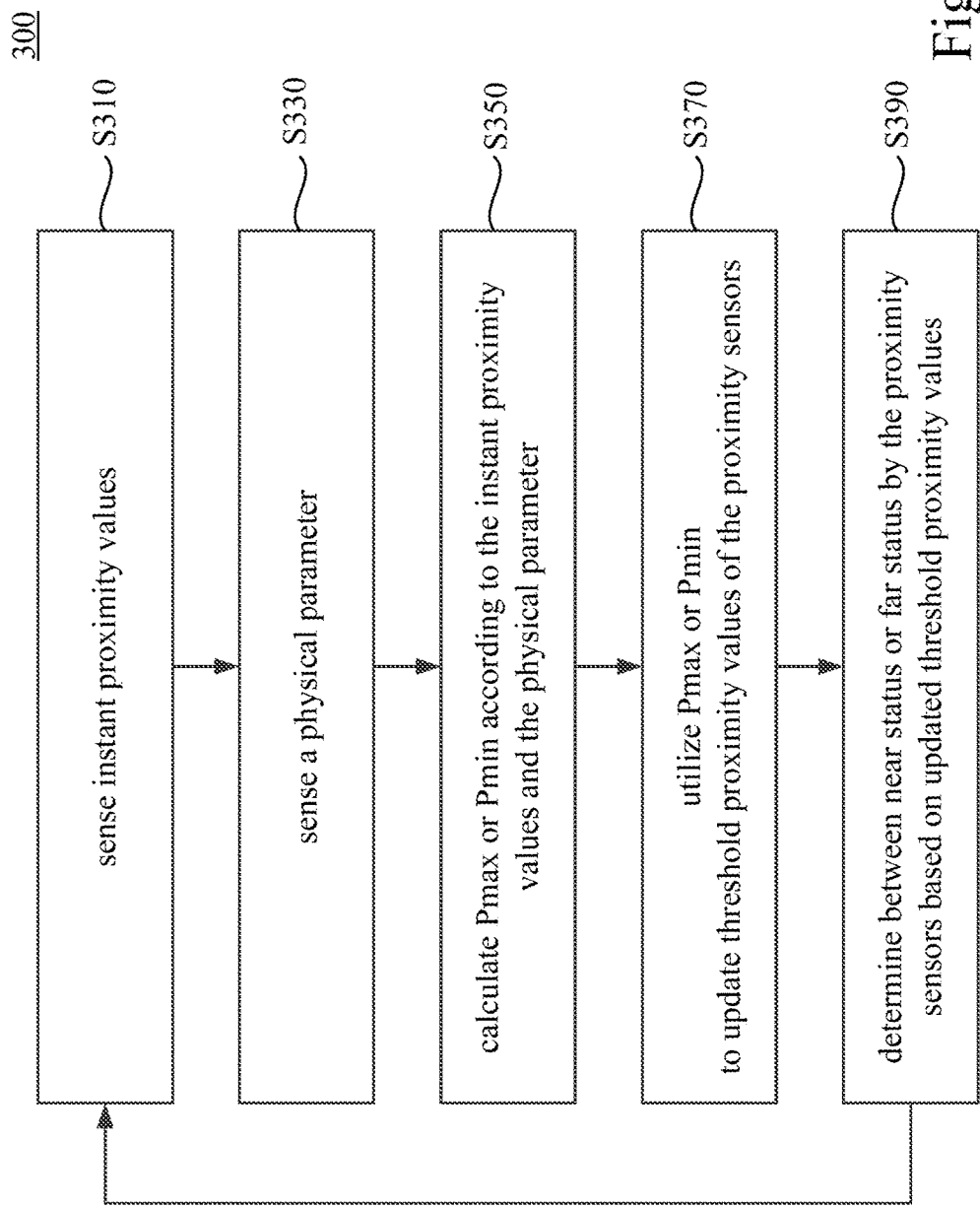
FIG. 3 is a flow chart diagram illustrating a proximity sensing method according to an embodiment of the disclosure.

Reference is also made to FIG. 3, which is a flow chart diagram illustrating a proximity sensing method 300 according to an embodiment of the disclosure. The proximity sensing method 300 is suitable to be used on the electronic system 100 in aforesaid embodiments.

Referring to FIG. 1A, FIG. 2, and FIG. 3, operation S310 is executed to sense instant proximity values by the proximity sensors 122a-122d disposed on a hand-held controller 120. In order to demonstrating this disclosure, it assumed that the instant proximity values generated by the proximity sensors 122a-122d are integers in a range from 0 to 100; the instant proximity values will be smaller when the objects are far; and the instant proximity values will be bigger when the objects are near. Corresponding to the hand gesture HG1 in FIG. 1A, the instant proximity values generated by the proximity sensors 122a-122d can be 24, 16, 86 and 89. Corresponding to the hand gesture HG2 in FIG. 1B, the instant proximity values generated by the proximity sensors 122a-122d can be 12, 86, 90 and 95.

However, the disclosure is not limited thereto. In some other embodiments, a skilled person in the art may configure the instant proximity values in different ranges (e.g., from 0 to 1, from −100 to 100, or from 0 to 10000) and in the opposite correlation relationship (e.g., the instant proximity values will be smaller when the objects are near).

Referring to FIG. 1A, FIG. 2, and FIG. 3, operation S330 is executed to sense a physical parameter by a physical information sensing circuit 124. In some embodiment, the physical information sensing circuit 124 can include a touch sensor, a pressure sensor or a temperature sensor.

In the embodiment shown in FIG. 1A and FIG. 1B, the physical information sensing circuit 124 includes a touch sensor for demonstration. The touch sensor can be implemented on a lateral side of the hand-held controller 120. When the user holds the hand-held controller 120, a palm area of user's hand will contact on the touch sensor (the physical information sensing circuit 124 shown in FIG. 3). In this case, the physical parameter includes a percentage of touched area detected by the touch sensor. In an embodiment, the percentage of touched area can indicate the user holds the hand-held controller 120 tighter or looser. When the percentage of touched area is higher, it indicates the user holds the hand-held controller 120 tighter. On the other hand, when the percentage of touched area is lower, it indicates the user holds the hand-held controller 120 looser. In another embodiment, the percentage of touched area can also indicate a size of user's hand. When the percentage of touched area is higher, the size of user's hand is bigger. On the other hand, when the percentage of touched area is lower, the size of user's hand is smaller.

When the physical information sensing circuit 124 includes the pressure sensor, the physical parameter can be a pressure reading about how much force the user applies on a surface of the physical information sensing circuit 124. In this case, the pressure reading can indicate the user holds the hand-held controller 120 tighter or looser.

When the physical information sensing circuit 124 includes the temperature sensor, the physical parameter can be a temperature reading about a current temperature on a surface of the physical information sensing circuit 124. Because, the human palm will have a temperature around 37 Celsius degree. In this case, if the temperature reading is adjacent to 37 Celsius degree, it indicates the user holds the hand-held controller 120 tight. On the other hand, if the temperature reading is away from 37 Celsius degree, it indicates the user holds the hand-held controller 120 loose or releases the hand-held controller 120.

Figure 4:
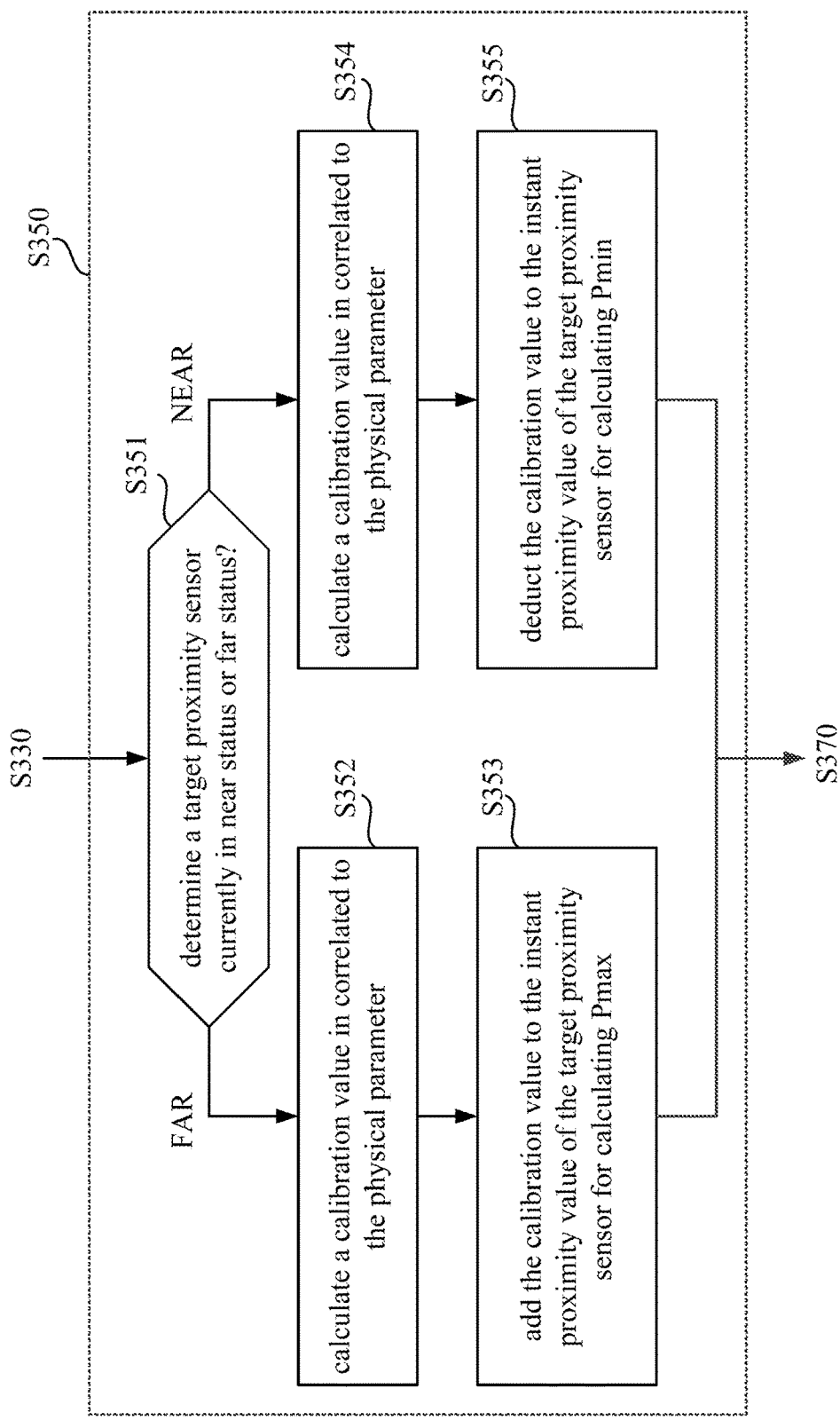
FIG. 4 is a flow chart diagram illustrating further details in one operation shown in FIG. 3 according to some embodiments of the disclosure.

Operation S350 is executed to calculate maximum proximity values or minimum proximity values according to the instant proximity values and the physical parameter by the computing application 140. Reference to further made to FIG. 4, which is a flow chart diagram illustrating further operations S351-S355 in the operation S350 shown in FIG. 3 according to some embodiments of the disclosure.

In order to demonstrating relationships between the instant proximity values, the physical parameter and maximum proximity values or minimum proximity values calculated by the computing application 140, Table 1 recites aforesaid values in an example in conditions that the user holds the hand-held controller 120 with the hand gesture HG1 shown in FIG. 1A and the percentage of touched area (the physical parameter) equals to 40%.

TABLE 1

|  | Proximity sensor | | | |
| --- | --- | --- | --- | --- |
|  | 122a | 122b | 122c | 122d |
| Instant proximity value | 24 | 16 | 86 | 89 |
| Threshold proximity value in default | 50 | 50 | 50 | 50 |
| Current status | far | far | near | near |
| Physical parameter | 40% | 40% | 40% | 40% |
| Calibration value | 20 | 20 | 40 | 40 |
| Pmax | 44 | 36 | x | x |
| Pmin | x | x | 46 | 49 |
| Updated threshold proximity value | 44 | 36 | 46 | 49 |

As the embodiment shown in FIG. 1A and FIG. 4, operation S350 is executed on each one of the proximity sensors 122a-122d respectively. The operation S351 is executed to determine a target proximity sensor (122a, 122b, 122c or 122d) from the proximity sensors 122a-122d is currently in near status or far status. Initially, the threshold proximity value for each one of the proximity sensors 122a-122d can be set in a default value (e.g., 50). Before the threshold proximity value is updated, each of the instant proximity values of the proximity sensors 122a-122d is compared to the threshold proximity value in default to determine whether the target proximity sensor is currently in near status or far status. As shown in Table 1, because the instant proximity value "24" of the proximity sensor 122a is below the threshold proximity value "50" in default, the proximity sensor 122a is currently in far status. Similarly, the proximity sensor 122b is currently in far status. Because, the instant proximity value "86" of the proximity sensor 122c exceeds the threshold proximity value "50" in default, the proximity sensor 122c is currently in near status. Similarly, the proximity sensor 122d is currently in near status.

For the proximity sensor 122a and the proximity sensor 122b in far status, operation S352 will be executed to calculate a calibration value in correlated to the physical parameter, which is 40% area being touched on the touch sensor. In this case, there is 40% area covered by user palm, and this physical parameter may indicate the user holds the hand-held controller 120 relatively loose or the size of user's hand is relatively smaller, such that the instant proximity values generated by the proximity sensors 122a-122d tend to be lower. In this case, the calibration value for the proximity sensor 122a and the proximity sensor 122b in far status are calculated to be "20" by the computing application 140.

For the proximity sensor 122a in far status, operation S353 will be executed to add the calibration value "20" to the instant proximity value "24" to calculate a maximum proximity value Pmax "24+20=44" for the proximity sensor 122a. Referring to FIG. 3, afterward, operation S370 is executed by the computing application 140 to utilize the maximum proximity value Pmax "44" to update the threshold proximity value of the proximity sensor 122a. In aforesaid embodiment, the calibration value is added to the instant proximity value to calculate the maximum proximity value Pmax, but the disclosure is not limited thereto. In another embodiment, the calibration value can be multiplied to the instant proximity value to calculate the maximum proximity value Pmax, and in this case the calibration value can be a positive number ranged from 1.00 to 10.00.

After the threshold proximity value is updated, operation S390 is executed that the proximity sensor 122a will utilize the updated threshold proximity value "44" in determining near status or far status. Afterward, if another instant proximity value is sensed by the proximity sensor 122a in the future exceeds 44, a result of the proximity sensor 122a will switch from far status into near status. If the instant proximity value sensed by the proximity sensor 122a in the future is lower than 44, a result of the proximity sensor 122a will remain in far status.

In this case, the proximity sensor 122a is calibrated to be more sensitive to far status (the threshold proximity value is adjusted from "50" to "44"), so as to calibrate a bias induced by the conditions that the user holds the hand-held controller 120 relatively loose or the size of user's hand is relatively smaller.

For the proximity sensor 122b in far status, operation S353 will be executed to add the calibration value "20" to the instant proximity value "16" to calculate a maximum proximity value Pmax "16+20=36" for the proximity sensor 122b. Referring to FIG. 3, afterward, operation S370 is executed to utilize the maximum proximity value "36" to update the threshold proximity value of the proximity sensor 122b. After the threshold proximity value is updated, operation S390 is executed that the proximity sensor 122b will utilize the updated threshold proximity value "36" in determining near status or far status.

In this case, the proximity sensor 122b is calibrated to be more sensitive to far status (the threshold proximity value is adjusted from "50" to "36"), so as to calibrate a bias induced by the conditions that the user holds the hand-held controller 120 relatively loose or the size of user's hand is relatively smaller. In this case, the calibration value "20" applied to the proximity sensors 122a and 122b are the same due to the physical parameter, but the maximum proximity values Pmax can be different for the proximity sensors 122a and 122b, because the proximity sensors 122a and 122b have different instant proximity values at first.

For the proximity sensor 122c and the proximity sensor 122d in near status, operation S354 will be executed to calculate a calibration value in correlated to the physical parameter, which is 40% area being touched on the touch sensor. In this case, there is 40% area covered by user palm, and this physical parameter may indicate the user holds the hand-held controller 120 relatively loose or the size of user's hand is relatively smaller, such that the instant proximity values generated by the proximity sensors 122a-122d tend to be lower. In this case, the calibration value for the proximity sensor 122c and the proximity sensor 122d in near status are calculated to be "40" by the computing application 140.

For the proximity sensor 122c in near status, operation S355 will be executed to deduct the calibration value "40" from the instant proximity value "86" to calculate a minimum proximity value Pmin "86−40=46" for the proximity sensor 122c. Referring to FIG. 3, afterward, operation S370 is executed to utilize the minimum proximity value Pmin "46" to update the threshold proximity value of the proximity sensor 122c. After the threshold proximity value is updated, operation S390 is executed that the proximity sensor 122c will utilize the updated threshold proximity value "46" in determining near status or far status. Afterward, if another instant proximity value is sensed by the proximity sensor 122c in the future exceeds 46, a result of the proximity sensor 122c will remain in near status. If another instant proximity value is sensed by the proximity sensor 122c is lower than 46, a result of the proximity sensor 122c will remain in far status. In aforesaid embodiment, the calibration value is deducted from the instant proximity value to calculate the minimum proximity value Pmin, but the disclosure is not limited thereto. In another embodiment, the calibration value can be multiplied to the instant proximity value to calculate the minimum proximity value Pmin, and in this case the calibration value can be a positive number ranged from 0.00 to 1.00.

In this case, the proximity sensor 122c is calibrated to be more sensitive to far status (the threshold proximity value is adjusted from "50" to "46").

For the proximity sensor 122d in near status, operation S355 will be executed to deduct the calibration value "40" from the instant proximity value "89" to calculate a minimum proximity value Pmin "89−40=49" for the proximity sensor 122d. Referring to FIG. 3, afterward, operation S370 is executed to utilize the minimum proximity value Pmin "49" to update the threshold proximity value of the proximity sensor 122d. After the threshold proximity value is updated, operation S390 is executed that the proximity sensor 122d will utilize the updated threshold proximity value "49" in determining near status or far status.

In this case, the calibration value "40" applied to the proximity sensors 122c and 122d are the same due to the physical parameter, but the minimum proximity value Pmin can be different for the proximity sensors 122c and 122d, because the proximity sensors 122c and 122d have different instant proximity values at first.

Aforesaid embodiment in Table 1 shows the example in conditions that the percentage of touched area (the physical parameter) equals to 40%. Reference is further made to Table 2. Table 2 recites another example in conditions that the user holds the hand-held controller 120 with the hand gesture HG1 shown in FIG. 1A and the percentage of touched area (the physical parameter) equals to 60%.

TABLE 2

|  | Proximity sensor | | | |
| --- | --- | --- | --- | --- |
|  | 122a | 122b | 122c | 122d |
| Instant proximity value | 24 | 16 | 86 | 89 |
| Threshold proximity value in default | 50 | 50 | 50 | 50 |
| Current status | far | far | near | near |
| Physical parameter | 60% | 60% | 60% | 60% |
| Calibration value | 40 | 40 | 20 | 20 |
| Pmax | 64 | 56 | x | x |
| Pmin | x | x | 66 | 69 |
| Updated threshold proximity value | 64 | 56 | 66 | 69 |

Compared to Table 1, the example shown in Table 2 is under the conditions that the percentage of touched area equals to 60%. It indicates that the user holds the hand-held controller 120 relatively tighter (compared to the example shown in Table 1) or the size of user's hand is relatively bigger (compared to the example shown in Table 1).

For the proximity sensor 122a and the proximity sensor 122b in far status, operation S352 will be executed to calculate a calibration value in correlated to the physical parameter, which is 60% area being touched on the touch sensor. In this case, there is 60% area covered by user palm, and this physical parameter may indicate the user holds the hand-held controller 120 relatively tighter or the size of user's hand is relatively bigger, such that the instant proximity values generated by the proximity sensors 122a-122d tend to be higher. In this case, the calibration value for the proximity sensor 122a and the proximity sensor 122b in far status are calculated to be "40" by the computing application 140. It is noticed that the calibration value "40" for the proximity sensor 122a and the proximity sensor 122b is now higher (compared to the example shown in Table 1).

As shown in Table 1 and Table 2, the calibration value for the proximity sensor 122a and the proximity sensor 122b in far status is calculated by the computing application 140 in positively correlated to the percentage of touched area.

For the proximity sensor 122a in far status, operation S353 is executed to add the calibration value "40" to the instant proximity value "24" to calculate a maximum proximity value Pmax "24+40=64" for the proximity sensor 122a. The operation S370 is executed to utilize the maximum proximity value "64" to update the threshold proximity value of the proximity sensor 122a. After the threshold proximity value is updated, operation S390 is executed that the proximity sensor 122a will utilize the updated threshold proximity value "64" in determining near status or far status.

For the proximity sensor 122b in far status, operation S353 is executed to add the calibration value "40" to the instant proximity value "16" to calculate a maximum proximity value Pmax "16+40=56" for the proximity sensor 122b. Similarly, operation S370 is executed to utilize the maximum proximity value "56" to update the threshold proximity value of the proximity sensor 122b. After the threshold proximity value is updated, operation S390 is executed that the proximity sensor 122b will utilize the updated threshold proximity value "56" in determining near status or far status.

For the proximity sensor 122c and the proximity sensor 122d in near status, operation S354 will be executed to calculate a calibration value in correlated to the physical parameter, which is 60% area being touched on the touch sensor. In this case, the calibration value for the proximity sensor 122c and the proximity sensor 122d in near status are calculated to be "20" by the computing application 140. Similarly, the operation S355 will be executed for the proximity sensor 122c and the proximity sensor 122d to calculate the minimum proximity values Pmin "66" and "69". The operation S370 will be executed to update the threshold proximity values for the proximity sensor 122c and the proximity sensor 122d into "66" and "69". As shown in Table 1 and Table 2, the calibration value for the proximity sensor 122c and the proximity sensor 122d in near status is calculated by the computing application 140 in negatively correlated to the percentage of touched area.

Table 3 recites still another example in conditions that the user holds the hand-held controller 120 with the hand gesture HG1 shown in FIG. 1A and the percentage of touched area (the physical parameter) equals to 80%.

TABLE 3

|  | Proximity sensor | | | |
| --- | --- | --- | --- | --- |
|  | 122a | 122b | 122c | 122d |
| Instant proximity value | 24 | 16 | 86 | 89 |
| Threshold proximity value in default | 50 | 50 | 50 | 50 |
| Current status | far | far | near | near |
| Physical parameter | 80% | 80% | 80% | 80% |
| Calibration value | 45 | 45 | 15 | 15 |
| Pmax | 69 | 61 | x | x |
| Pmin | x | x | 71 | 74 |
| Updated threshold proximity value | 69 | 61 | 71 | 74 |

As shown in Table 1, Table 2 and Table 3, the calibration value for the proximity sensor 122a and the proximity sensor 122b in far status is calculated by the computing application 140 in positively correlated to the percentage of touched area. The calibration value "45" is calculated for the proximity sensor 122a and the proximity sensor 122b corresponding to 80% area being touched. The calibration value for the proximity sensor 122c and the proximity sensor 122d in near status is calculated by the computing application 140 in negatively correlated to the percentage of touched area. The calibration value "15" is calculated for the proximity sensor 122c and the proximity sensor 122d corresponding to 80% area being touched.

In aforesaid embodiment, the operation S370 shown in FIG. 3 is executed to update the threshold proximity values of the proximity sensors 122a-122d with the maximum proximity values Pmax or the minimum proximity values Pmin calculated in the operation S350.

In one embodiment, the threshold proximity values are updated immediately after the maximum proximity values Pmax or the minimum proximity values Pmin are calculated in the operation S350.

Figure 5:
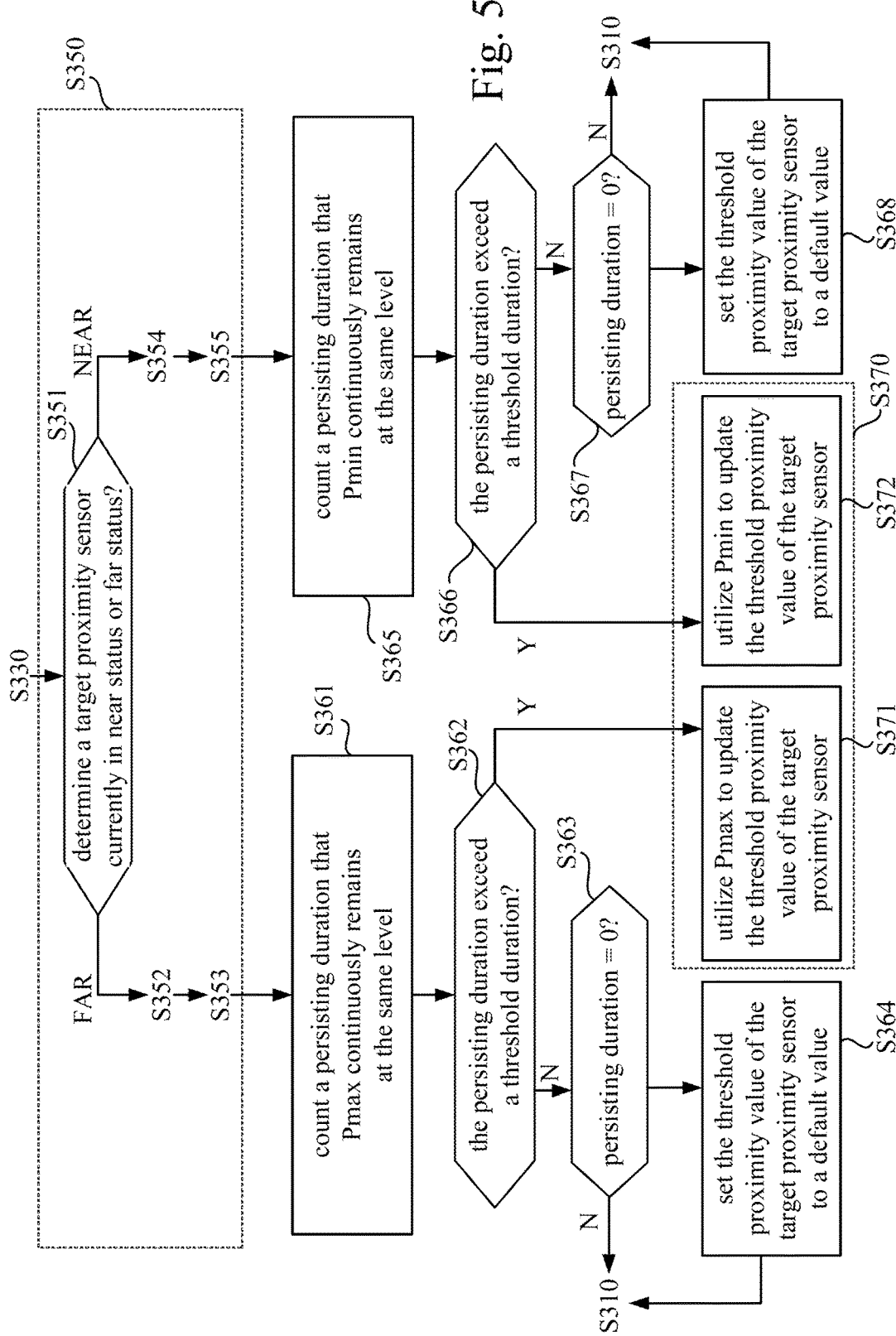
FIG. 5 is a flow chart diagram illustrating further operations executed between two operations shown in FIG. 3 according to some embodiments of the disclosure.

In another embodiment, the threshold proximity values will not be updated immediately after the maximum proximity values Pmax or the minimum proximity values Pmin are calculated in the operation S350. Reference is further made to FIG. 5, which is a flow chart diagram illustrating further operations S361-S367 executed between operations S350 and S370 according to some embodiments of the disclosure.

As the embodiments shown in FIG. 5, the proximity sensing method further includes operations S361-S364 after the operation S353. In some embodiment, the proximity sensors 122a-122d will generate instant proximity values periodically, such as the proximity sensor 122a will generate a new instant proximity value every 0.1 second.

For example, the maximum proximity values Pmax for the proximity sensor 122a will be calculated in every 0.1 second. After the maximum proximity values Pmax are calculated in the operation S353, the operation S361 is executed to count a persisting duration that the maximum proximity values Pmax continuously remain at the same or similar level. In this case, if the instant proximity value of the proximity sensor 122a remains the same for 0.3 second, the persisting duration will be counted to 3 counts (or 0.3 second). If the instant proximity value of the proximity sensor 122a remains the same or similar for 1 second, the persisting duration will be counted to 10 counts (or 1 second). S362 is executed to determine whether the persisting duration exceeds threshold duration or not. For example, the threshold duration can be set to 5 counts (or 0.5 second). If the persisting duration exceeds threshold duration, the operation S371 will be executed to utilize the maximum proximity values Pmax for the proximity sensor 122a to update the threshold proximity value of the proximity sensor 122a.

If the persisting duration is below the threshold duration, the operation S363 will be executed to determine whether the persisting duration is equal to zero (i.e., an initial stage to set the threshold proximity value) or not. If the persisting duration is equal to zero, the operation S364 will be executed to set the threshold proximity value for the proximity sensor 122a to a default value (e.g., 50) and return to operation S310 for further sensing. If the persisting duration is not equal to zero, the proximity sensing method return to operation S310 for further sensing.

On the other hand, as the embodiments shown in FIG. 5, the proximity sensing method further includes operations S365-S368 after the operation S355. For example, the minimum proximity values Pmin for the proximity sensor 122c will be calculated in every 0.1 second. After the minimum proximity values Pmin are calculated in the operation S355, the operation S365 is executed to count a persisting duration that the minimum proximity values Pmin continuously remain at the same or similar level. S366 is executed to determine whether the persisting duration exceeds threshold duration or not. If the persisting duration exceeds threshold duration, the operation S372 will be executed to utilize the minimum proximity values Pmin for the proximity sensor 122c to update the threshold proximity value of the proximity sensor 122c.

If the persisting duration is below the threshold duration, the operation S367 will be executed to determine whether the persisting duration is equal to zero (i.e., an initial stage to set the threshold proximity value) or not. If the persisting duration is equal to zero, the operation S368 will be executed to set the threshold proximity value for the proximity sensor 122c to a default value (e.g., 50) and return to operation S310 for further sensing. If the persisting duration is not equal to zero, the proximity sensing method return to operation S310 for further sensing.

Based on the operation S361-S368 shown in FIG. 5, the proximity sensing method will not update the threshold proximity value immediately once the maximum proximity values Pmax or the minimum proximity values Pmin change. Instead, the proximity sensing method will update the threshold proximity value after the maximum proximity values Pmax or the minimum proximity values Pmin change to new levels and then remain steady for a persisting duration. In this case, the threshold proximity value will not be affected by temporary or dramatically changes on few samples of the instant proximity values sensed by the proximity sensors 122a-122d.

The physical parameter in aforesaid embodiments includes a percentage of touched area detected by the physical information sensing circuit 140 shown in FIG. 2. The percentage of touched area is utilized to calculate the calibration values for the proximity sensors 122a-122d. However, the disclosure is not limited thereto. The physical parameter can also include a temperature reading or a pressure reading detected by the physical information sensing circuit 140 shown in FIG. 2. The calibration values can be calculate in correlated with the pressure reading or the temperature reading.

In aforesaid embodiment, the proximity sensors 122a-122d utilize one singular percentage of touched area detected by the physical information sensing circuit 140 to calculate the calibration values. However, the disclosure is not limited thereto.

Figure 6:
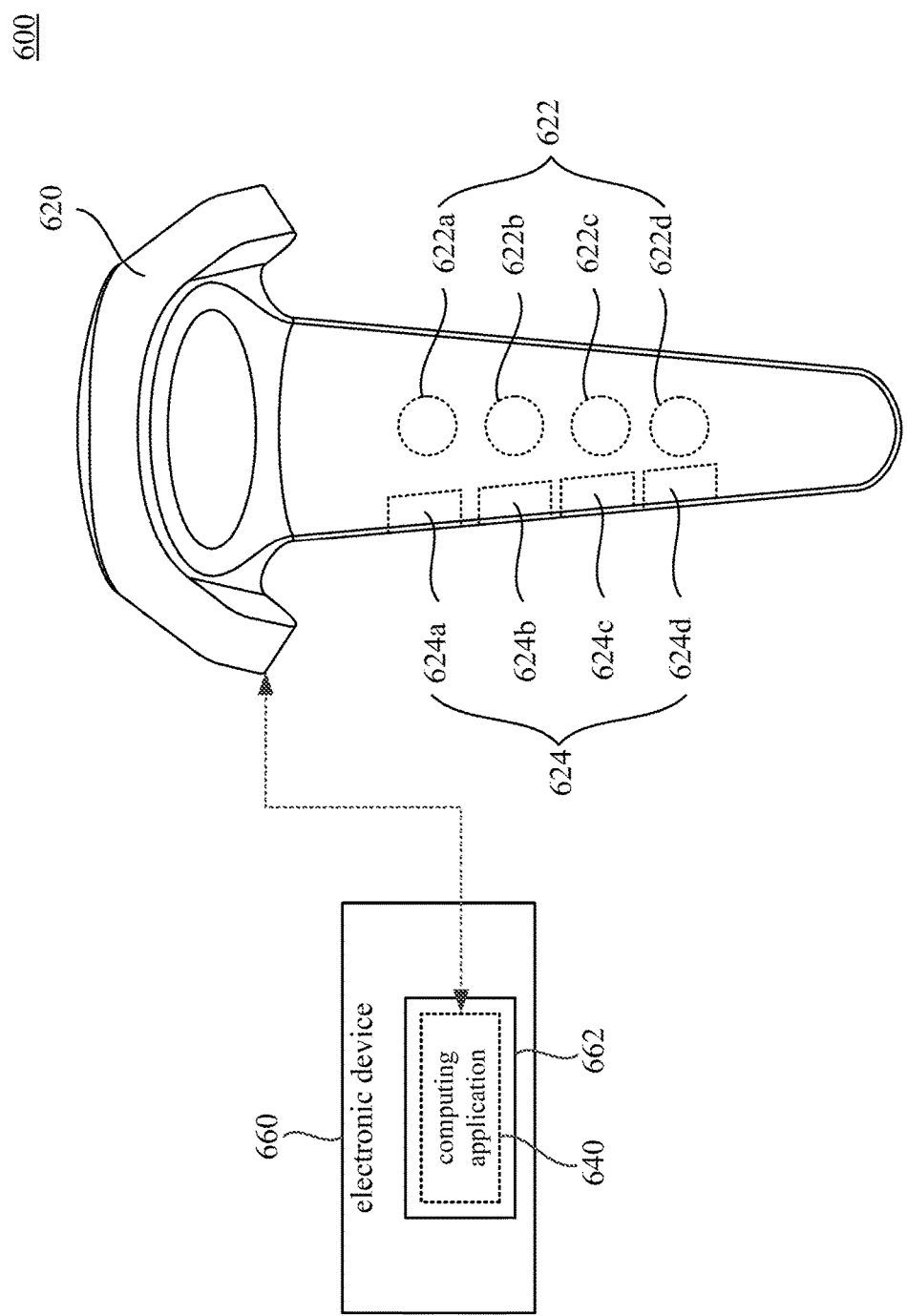
FIG. 6 is a schematic diagram illustrating an electronic system according to some embodiments of the present disclosure.

Reference is also made to FIG. 6, which is a schematic diagram illustrating an electronic system 600 according to some embodiments of the present disclosure. As illustrated in FIG. 6, in one embodiment, the electronic system 600 includes a hand-held controller 620 and a computing application 640. The computing application 640 is executed by a processor 662 of a computing device 660. The computing device 660 is communicatively connected through a wireless connection (e.g., WiFi, Bluetooth, BLE or IR) or a wired connection (e.g., via a cable wiring) to the hand-held controller 620. The hand-held controller 620 includes a proximity sensing circuit 622 and a physical information sensing circuit 624. In the embodiment shown in FIG. 6, the proximity sensing circuit 622 includes four proximity sensors 622a-622d, and the physical information sensing circuit includes four physical information sensors 624a-624d. Each of the physical information sensors 624a, 624b, 624c and 624d are disposed corresponding to one of the proximity sensors 622a, 622b, 622c and 622d. For example, the physical information sensors 624a is disposed adjacent the proximity sensor 622a; the physical information sensors 624b is disposed adjacent the proximity sensor 622b; the physical information sensors 624c is disposed adjacent the proximity sensor 622c; and the physical information sensors 624d is disposed adjacent the proximity sensor 622d.

The physical parameter includes physical data respectively sensed by the physical information sensors 624a-624d. The computing application 640 is configured to calculate calibration values in correlated to the physical data respectively. The computing application 640 is configured to calculate the maximum proximity values by adding or multiplying the calibration values respectively to the instant proximity values, or calculate the minimum proximity values by deducting or multiplying the calibration values respectively to the instant proximity values.

In order to demonstrating relationships between the instant proximity values, the physical parameter and maximum proximity values or minimum proximity values calculated by the computing application 640, Table 4 recites aforesaid values in an example in conditions the percentages of touched area (the physical parameter) are individually detected by the physical information sensors 624a, 624b, 624c and 624d.

TABLE 4

|  | Proximity sensor | | | |
| --- | --- | --- | --- | --- |
|  | 622a | 622b | 622c | 622d |
| Instant proximity value | 24 | 16 | 86 | 89 |
| Threshold proximity value in default | 50 | 50 | 50 | 50 |
| Current status | far | far | near | near |
| Physical parameter | 40% | 60% | 60% | 80% |
| Calibration value | 20 | 40 | 20 | 15 |
| Pmax | 44 | 56 | x | x |
| Pmin | x | x | 66 | 74 |
| Updated threshold proximity value | 44 | 56 | 66 | 74 |

As shown in FIG. 6 and Table 4, the physical information sensing circuit includes four physical information sensors 624a-624d. The physical parameter includes four physical data respectively sensed by the physical information sensors 624a-624d. In an embodiment, the physical information sensors 624a-624d can be four separated touch sensors as shown in FIG. 6. In another embodiment, the physical information sensors 624a-624d can be four sensing areas (not shown in figures) implemented by one touch panel. In the example shown in Table 4, the percentages of touched areas sensed by the physical information sensors 624a-624d are 40%, 60%, 60% and 80%.

Figure 7:
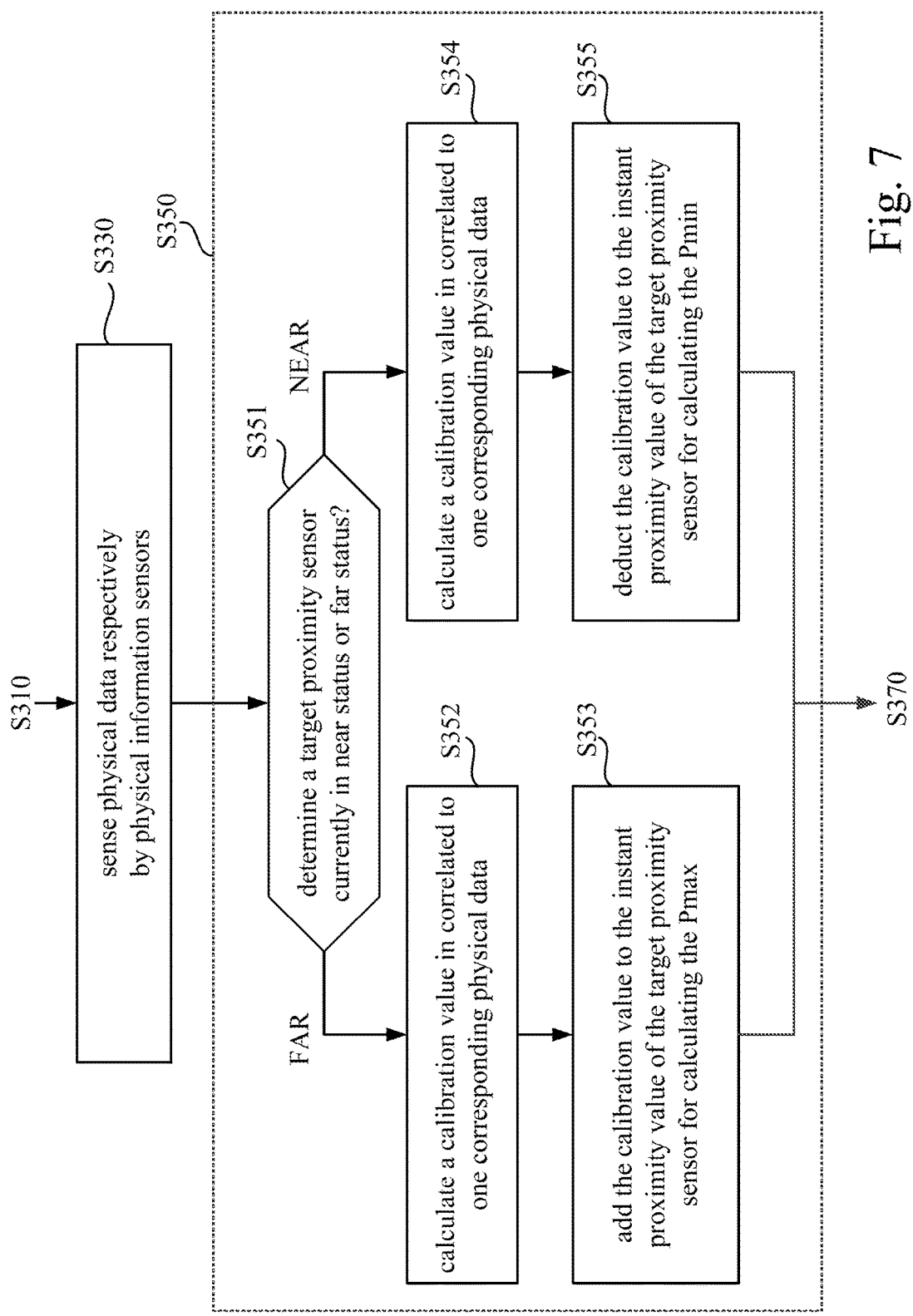
FIG. 7 is a flow chart diagram illustrating further details of operations shown in FIG. 3 corresponding to embodiments shown in FIG. 6.

Reference is further made to FIG. 7, which is a flow chart diagram illustrating further details of operations S330 and S350 shown in FIG. 3 corresponding to embodiments shown in FIG. 6. As shown in FIG. 7, the operation S330 is executed to sense physical data (40%, 60%, 60% and 80% touched area) respectively by the physical information sensors 624a-624d.

For the physical information sensors 624a in far status, the operation S352 is executed to calculate a calibration value "20" in correlated to one corresponding physical data (40% touched area). The operation S353 is executed to add the calibration value "20" to the instant proximity value "24" for calculating the maximum proximity value Pmax "24+20=44".

For the physical information sensors 624b in far status, the operation S352 is executed to calculate a calibration value "40" in correlated to one corresponding physical data (60% touched area). The operation S353 is executed to add the calibration value "40" to the instant proximity value "16" for calculating the maximum proximity value Pmax "16+40=56".

For the physical information sensors 624c in near status, the operation S354 is executed to calculate a calibration value "20" in correlated to one corresponding physical data (60% touched area). The operation S355 is executed to deduct the calibration value "20" from the instant proximity value "86" for calculating the minimum proximity value Pmin "86−20=66".

For the physical information sensors 624d in near status, the operation S354 is executed to calculate a calibration value "15" in correlated to one corresponding physical data (80% touched area). The operation S355 is executed to deduct the calibration value "15" from the instant proximity value "89" for calculating the minimum proximity value Pmin "89−15=74".

Based on FIG. 6 and FIG. 7, the calibration values for the physical information sensors 624a-624d are calculated respectively according to the physical data respectively sensed by the physical information sensors 624a-624d, such that each of the proximity sensors 622a-622d can be calibrated individually according to different physical data.

In aforesaid embodiments as shown in FIG. 4, FIG. 5 and FIG. 7, the physical parameter is utilized to calculate a calibration value to increase or reduce the maximum proximity value (Pmax) or the minimum proximity value (Pmin), but the disclosure is not limited thereto.

Figure 8:
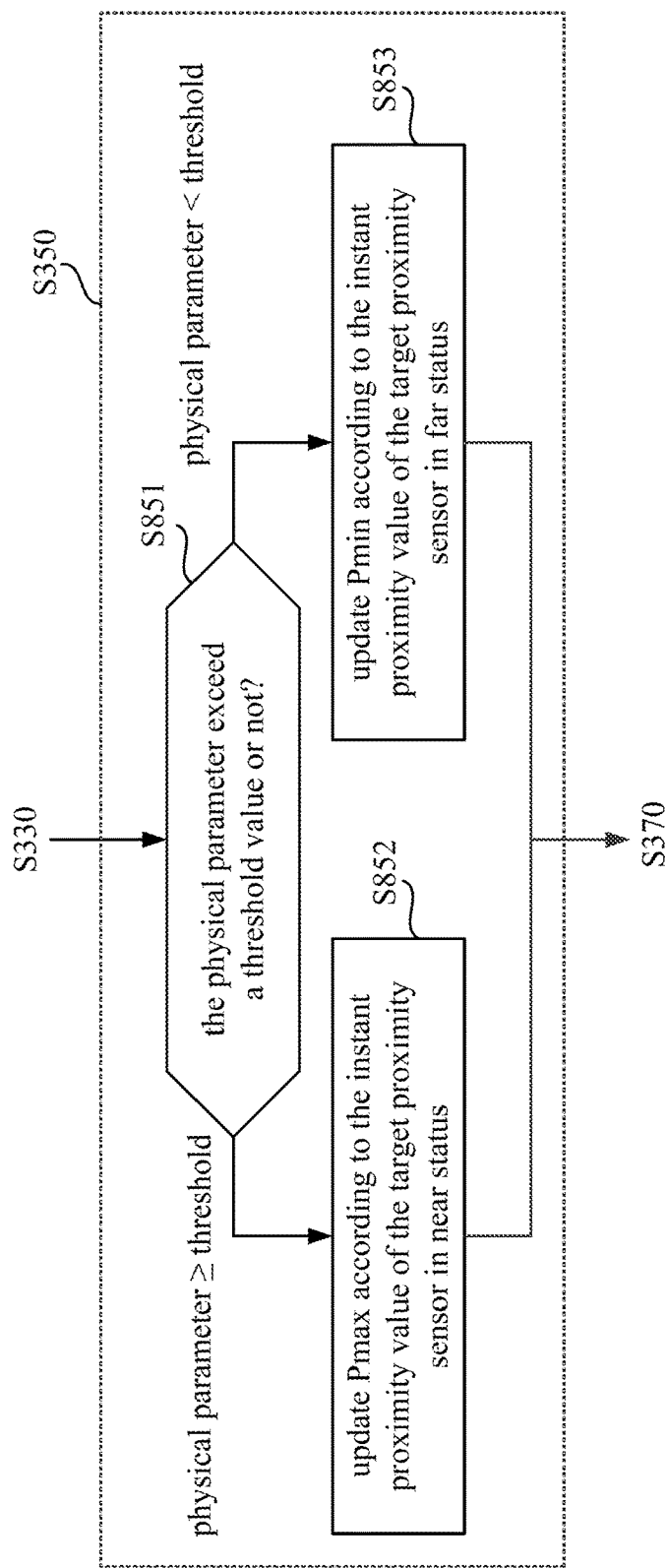
FIG. 8 is a flow chart diagram illustrating further details in one operation shown in FIG. 3 according to some embodiments of the disclosure.

In some other embodiments, the physical parameter can be utilized to decide whether to update Pmax/Pmin or not. Reference is further made to FIG. 8, which is a flow chart diagram illustrating further details in one operation S350 shown in FIG. 3 according to some embodiments of the disclosure.

As the embodiment shown in FIG. 1A and FIG. 8, operation S350 is executed on each one of the proximity sensors 122a-122d respectively. The operation S851 is executed to compare the physical parameter with a threshold value. For example, when the physical parameter is a percentage of touched area detected by the touch sensor, the threshold value can be configured as 40% (which means that 40% of whole sensing area of the touch sensor sense a touch contact).

When the physical parameter exceeds the threshold value (more than 40% of whole sensing area of the touch sensor sense a touch contact), operation S852 is executed to update the maximum proximity value Pmax of the proximity sensors currently in the near status according to the instant proximity value. In order to demonstrating relationships between the instant proximity values, the physical parameter and maximum proximity values or minimum proximity values, Table 5 recites aforesaid values in an example in conditions the percentages of touched area (the physical parameter) are 65% over the threshold value.

TABLE 5

|  | Proximity sensor | | | |
| --- | --- | --- | --- | --- |
|  | 122a | 122b | 122c | 122d |
| Instant proximity value | 24 | 16 | 86 | 89 |
| Threshold proximity value in default | 50 | 50 | 50 | 50 |
| Current status | far | far | near | near |
| Physical parameter | 65 | 65 | 65 | 65 |
| Pmax | x | x | 86 | 89 |
| Pmin | x | x | x | x |

As shown in FIG. 8 and Table 5, when the physical parameter is detected to be 65% (which means the user may grip the hand-held controller 120 tighter), the operation S852 is executed to update the maximum proximity values of the proximity sensor 122c and 122d to be equal to the instant proximity values sensed by the proximity sensors 122c and 122d. As shown in Table 5, the maximum proximity value Pmax of the proximity sensor 122c is updated to "86", and the maximum proximity value Pmax of the proximity sensor 122d is updated to "89". In this case, the maximum proximity values or minimum proximity values of the proximity sensors 122a and 122b remains unchanged.

On the other hand, when the physical parameter is lower the threshold value (more than 40% of whole sensing area of the touch sensor sense a touch contact), operation S853 is executed to update the minimum proximity value Pmin of the proximity sensors currently in the near status according to the instant proximity value. In order to demonstrating relationships between the instant proximity values, the physical parameter and maximum proximity values or minimum proximity values, Table 6 recites aforesaid values in an example in conditions the percentages of touched area (the physical parameter) are 25% below the threshold value. The updated maximum proximity values on the proximity sensors 122c and 122d can be utilized to update the threshold proximity value of the proximity sensors 122c and 122d in determining near/far event.

TABLE 6

|  | Proximity sensor | | | |
| --- | --- | --- | --- | --- |
|  | 122a | 122b | 122c | 122d |
| Instant proximity value | 24 | 16 | 86 | 89 |
| Threshold proximity value in default | 50 | 50 | 50 | 50 |
| Current status | far | far | near | near |
| Physical parameter | 25 | 25 | 25 | 25 |
| Pmax | x | x | x | x |
| Pmin | 24 | 16 | x | x |

As shown in FIG. 8 and Table 6, when the physical parameter is detected to be 25% (which means the user may grip the hand-held controller 120 looser), the operation S853 is executed to update the minimum proximity values of the proximity sensors 122a and 122b to be equal to the instant proximity values sensed by the proximity sensors 122a and 122b. As shown in Table 5, the minimum proximity value Pmin of the proximity sensor 122a is updated to "24", and the minimum proximity value Pmin of the proximity sensor 122b is updated to "16". In this case, the maximum proximity values or minimum proximity values of the proximity sensors 122c and 122d remains unchanged. The updated maximum proximity values on the proximity sensors 122a and 122b can be utilized to update the threshold proximity value of the proximity sensors 122a and 122b in determining near/far event. In embodiment shown in FIG. 8, the physical parameter can be utilized to decide when and whether to update Pmax/Pmin or not.

In another embodiment, the operation S851-S853 shown in FIG. 8 can be utilized on the embodiment shown in FIG. 6 with individual physical information sensors 624a, 624b, 624c and 624d are disposed corresponding to one of the proximity sensors 622a, 622b, 622c and 622d. In this case, each of the proximity sensors 622a-622d can update the maximum proximity value or minimum proximity value selectively according to one physical parameter collected by one of the physical information sensors 624a-624d respectively.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An electronic system, comprising:
    a hand-held controller comprising:
        a proximity sensing circuit comprising a plurality of proximity sensors, the proximity sensors being configured to sense a plurality of instant proximity values; and
        a physical information sensing circuit configured to sense a physical parameter;
    a computing application, executed by a processor, configured to retrieve the instant proximity values and the physical parameter, to calculate a plurality of maximum proximity values or minimum proximity values according to the instant proximity values and the physical parameter, the maximum proximity values or the minimum proximity values being utilized to update a plurality of threshold proximity values of the proximity sensors in determining near status or far status.

2. The electronic system of claim 1, wherein each of the instant proximity values corresponds to a gap distance from each of the proximity sensors to an object.

3. The electronic system of claim 2, wherein the proximity sensors are configured to obtain finger positions while the hand-held controller is held by a hand.

4. The electronic system of claim 1, wherein the computing application is configured to calculate the maximum proximity values by adding or multiplying a calibration value to the instant proximity values, the calibration value is calculated by the computing application in correlated to the physical parameter.

5. The electronic system of claim 4, wherein the physical information sensing circuit comprises a touch sensor, and the physical parameter comprises a percentage of touched area detected by the touch sensor, the calibration value is calculated by the computing application in positively correlated to the percentage of touched area.

6. The electronic system of claim 4, wherein the physical information sensing circuit comprises a pressure sensor or a temperature sensor, the physical parameter comprises a pressure reading of the pressure sensor or a temperature reading of the temperature sensor.

7. The electronic system of claim 1, wherein the physical information sensing circuit comprises a plurality of physical information sensors, each of the physical information sensors are disposed corresponding to one of the proximity sensors, and the physical parameter comprises physical data respectively sensed by the physical information sensors, the computing application is configured to calculate the maximum proximity values by adding a plurality of calibration values respectively to the instant proximity values, the calibration values are calculated by the computing application in correlated to the physical data respectively.

8. The electronic system of claim 1, wherein the computing application is configured to calculate the minimum proximity values by deducting or multiplying a calibration value to the instant proximity values, the calibration value is calculated by the computing application in correlated to the physical parameter.

9. The electronic system of claim 8, wherein the physical information sensing circuit comprises a touch sensor, a pressure sensor or a temperature sensor, and the physical parameter comprises a percentage of touched area detected by the touch sensor, a pressure reading of the pressure sensor or a temperature reading of the temperature sensor.

10. The electronic system of claim 1, wherein the computing application is configured to update the threshold proximity values of the proximity sensors in response to that the maximum proximity values or minimum proximity values continuously remain at the same level for a persisting duration.

11. A proximity sensing method, comprising:
    sensing a plurality of instant proximity values by a plurality of proximity sensors disposed on a hand-held controller;
    sensing a physical parameter by a physical information sensing circuit disposed on the hand-held controller;
    calculating a plurality of maximum proximity values or minimum proximity values according to the instant proximity values and the physical parameter; and
    utilizing the maximum proximity values or the minimum proximity values to update a plurality of threshold proximity values of the proximity sensors in determining near status or far status.

12. The proximity sensing method of claim 11, wherein each of the instant proximity values corresponds to a gap distance from each of the proximity sensors to an object.

13. The proximity sensing method of claim 12, further comprising:
    obtaining finger positions by the proximity sensors while the hand-held controller is held by a hand.

14. The proximity sensing method of claim 11, wherein the step of calculating the maximum proximity values comprises:
    calculating a calibration value in correlated to the physical parameter; and
    adding the calibration value to the instant proximity values for calculating the maximum proximity values.

15. The proximity sensing method of claim 14, wherein the physical information sensing circuit comprises a touch sensor, and the physical parameter comprises a percentage of touched area detected by the touch sensor, the calibration value is calculated in positively correlated to the percentage of touched area.

16. The proximity sensing method of claim 14, wherein the physical information sensing circuit comprises a pressure sensor or a temperature sensor, the physical parameter comprises a pressure reading of the pressure sensor or a temperature reading of the temperature sensor.

17. The proximity sensing method of claim 11, wherein the physical information sensing circuit comprises a plurality of physical information sensors, each of the physical information sensors are disposed corresponding to one of the proximity sensors, and the physical parameter comprises a plurality of physical data respectively sensed by the physical information sensors, the step of calculating the maximum proximity values or minimum proximity values comprises:
  calculating a plurality of calibration values in correlated to the physical data respectively sensed by the physical information sensors; and
  adding the calibration values respectively to the instant proximity values for calculating the maximum proximity values.

18. The proximity sensing method of claim 11, wherein the step of calculating the maximum proximity values or minimum proximity values comprises:
  calculating a calibration value in correlated to the physical parameter; and
  deducting the calibration value to the instant proximity values for calculating the minimum proximity values.

19. The proximity sensing method of claim 18, wherein the physical information sensing circuit comprises a touch sensor, a pressure sensor or a temperature sensor, and the physical parameter comprises a percentage of touched area detected by the touch sensor, a pressure reading of the pressure sensor or a temperature reading of the temperature sensor.

20. The proximity sensing method of claim 11, wherein the threshold proximity values of the proximity sensors are updated in response to that the maximum proximity values or minimum proximity values remain at the same level for a continuous duration.

* * * * *